(12) United States Patent
Kim et al.

(10) Patent No.: US 9,257,599 B2
(45) Date of Patent: Feb. 9, 2016

(54) SEMICONDUCTOR LIGHT EMITTING DEVICE INCLUDING HOLE INJECTION LAYER

(71) Applicants: Jae-kyun Kim, Hwaseong-si (KR);
Joo-sung Kim, Seongnam-si (KR);
Jun-youn Kim, Hwaseong-si (KR);
Young-soo Park, Yongin-si (KR);
Young-jo Tak, Hwaseong-si (KR)

(72) Inventors: Jae-kyun Kim, Hwaseong-si (KR);
Joo-sung Kim, Seongnam-si (KR);
Jun-youn Kim, Hwaseong-si (KR);
Young-soo Park, Yongin-si (KR);
Young-jo Tak, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/288,824

(22) Filed: May 28, 2014

(65) Prior Publication Data

US 2015/0060762 A1   Mar. 5, 2015

(30) Foreign Application Priority Data

Aug. 28, 2013 (KR) ........................ 10-2013-0102667

(51) Int. Cl.
*H01L 21/00* (2006.01)
*H01L 29/06* (2006.01)
(Continued)

(52) U.S. Cl.
CPC .............. *H01L 33/06* (2013.01); *H01L 33/007* (2013.01); *H01L 33/14* (2013.01); *H01L 33/32* (2013.01); *H01L 33/12* (2013.01)

(58) Field of Classification Search
CPC . H01L 33/0008; H01L 33/06; H01L 33/0062; H01L 33/145; H01L 33/0075; H01L 33/32; H01L 33/0818
USPC .......... 438/22, 25, 26, 29, 42–47; 257/13, 14, 257/21, 80, 90
See application file for complete search history.

(56) References Cited

U.S. PATENT DOCUMENTS 6,329,667 B1 * 12/2001 Ota et al. .................... 257/13
6,372,608 B1    4/2002  Shimoda et al.
(Continued)

FOREIGN PATENT DOCUMENTS

JP    2008539585 A    11/2008
JP    4882618 B2    2/2012
(Continued)

OTHER PUBLICATIONS

Feb. 4, 2015 Official Communication (Extended European Search Report) received in corresponding European Application No. 14182021.7-1551/2843714.
(Continued)

*Primary Examiner* — Hsien Ming Lee
(74) *Attorney, Agent, or Firm* — Harness, Dickey & Pierce, P.L.C.

(57) ABSTRACT

According to example embodiments, a semiconductor light emitting device includes a first semiconductor layer, a pit enlarging layer on the first semiconductor layer, an active layer on the pit enlarging layer, a hole injection layer, and a second semiconductor layer on the hole injection layer. The first semiconductor layer is doped a first conductive type. An upper surface of the pit enlarging layer and side surfaces of the active layer define pits having sloped surfaces on the dislocations. The pits are reverse pyramidal spaces. The hole injection layer is on a top surface of the active layer and the sloped surfaces of the pits. The second semiconductor layer doped a second conductive type that is different than the first conductive type.

20 Claims, 8 Drawing Sheets

(51) Int. Cl.
  *H01L 33/00* (2010.01)
  *H01L 33/06* (2010.01)
  *H01L 33/14* (2010.01)
  *H01L 33/32* (2010.01)
  *H01L 33/12* (2010.01)

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,115,908 B2 | 10/2006 | Watanabe et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,446,345 B2 | 11/2008 | Emerson et al. |
| 7,501,656 B2 | 3/2009 | Han et al. |
| 7,611,917 B2 | 11/2009 | Emerson et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,640 B2 | 10/2011 | Oh et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0246612 A1 | 11/2006 | Emerson et al. |
| 2007/0181869 A1* | 8/2007 | Gaska et al. ............. 257/14 |
| 2009/0029493 A1* | 1/2009 | Emerson et al. .......... 438/22 |
| 2011/0037049 A1 | 2/2011 | Tachibana et al. |
| 2011/0121357 A1 | 5/2011 | Lester et al. |
| 2011/0309327 A1 | 12/2011 | Jeong |
| 2012/0205618 A1 | 8/2012 | Nakamura |
| 2013/0049012 A1 | 2/2013 | Figuet et al. |
| 2013/0082236 A1 | 4/2013 | Ramer et al. |
| 2013/0082273 A1 | 4/2013 | Ting |

FOREIGN PATENT DOCUMENTS

| | | |
|---|---|---|
| JP | 2012-069982 | 5/2012 |
| JP | 2012169383 A | 9/2012 |
| KR | 101018116 B1 | 2/2011 |
| KR | 20120079669 A | 7/2012 |

OTHER PUBLICATIONS

Sang-Heon Han et al., "Improvement of efficiency and electrical properties using intentionally formed V-shaped pits in InGaN multiple quantum well light-emitting diodes" Applied Physics Letters 102, 251123 (2013).

* cited by examiner

FIG. 6
|  | LEAKAGE CURRENT | | OPERATING VOLTAGE | | | OUTPUT POWER |
| --- | --- | --- | --- | --- | --- | --- |
|  | IR(nA) | IF(nA) | VR(V) | VF1(V) | VF2(V) | PO(mW) |
| COMPARATIVE EMBODIMENT | 3.05 | 3.01 | 28.88 | 2.33 | 3.42 | 426.36 |
| EXAMPLE EMBODIMENTS (FIG. 4) | 3.35 | 3.15 | 40.00 | 2.30 | 3.37 | 459.49 |
FIG. 7A
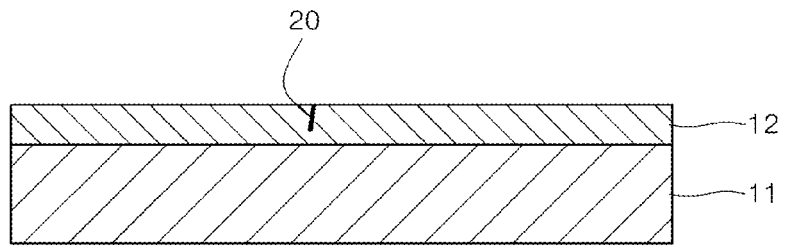
FIG. 7B
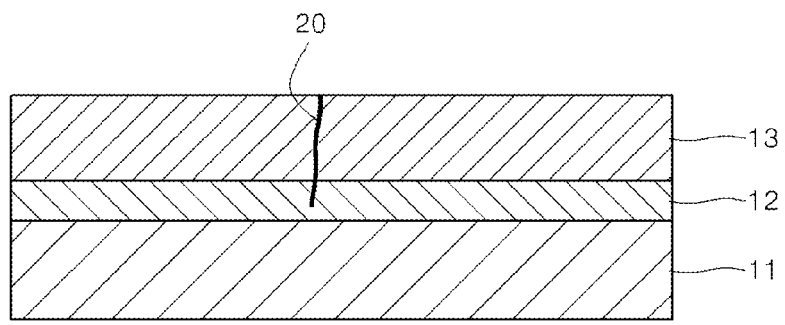

SEMICONDUCTOR LIGHT EMITTING DEVICE INCLUDING HOLE INJECTION LAYER

CROSS-REFERENCE TO RELATED APPLICATIONS

This application claims priority under 35 U.S.C. §119 to Korean Patent Application No. 10-2013-0102667, filed on Aug. 28, 2013 in the Korean Intellectual Property Office, the disclosure of which is incorporated herein in its entirety by reference.

BACKGROUND

1. Field

The present disclosure relates to a semiconductor light emitting device and/or a method of fabricating the same, and more particularly, to a semiconductor light emitting device of which luminescence efficiency is improved by increasing hole injection to an active layer by using a hole injection layer and/or a method of fabricating the same.

2. Description of Related Art

A semiconductor light emitting device (LED), for example, a LED using a Group III-V compound semiconductor such as gallium nitride (GaN), has received a lot of attention in various fields including illumination engineering and display devices due to its superior efficiency for converting electric energy into light, compared to an incandescent light or a fluorescent light. In illumination engineering fields, a white light emitting device may be used. Currently, a white light may be formed by combining a phosphor with a blue light emitting device.

In such white light emitting devices, luminescence efficiency may be an important factor for evaluating the converted light energy against supplied electric energy. Generally, luminescence efficiency may significantly deteriorate as a current increases in a blue light emitting device. The phenomenon is referred to as efficiency droop. Various research is currently being made to address the efficiency droop.

Efficiency droop of a blue light emitting device may occur due to various causes. For example, known causes for efficiency droop include high defect densities due to a lattice mismatch between GaN and a substrate, relatively low mobility of holes, and overflow of electrons. Particularly, in a multiple quantum well (MQW) structure including a plurality of quantum wells (e.g., from 5 to 10), light may be mainly emitted only at quantum wells close to p-GaN due to low mobility of holes.

SUMMARY

According to example embodiments, a semiconductor light emitting device includes a first semiconductor layer, a pit enlarging layer on the first semiconductor layer, an active layer on the pit enlarging layer, a hole injection layer, and a second semiconductor layer on the hole injection layer. The first semiconductor layer is doped a first conductive type and includes a plurality of dislocations therein. An upper surface of the pit enlarging layer and side surfaces of the active layer define pits having sloped surfaces on the dislocations. The pits are reverse pyramidal spaces. The hole injection layer is on a top surface of the active layer and the sloped surfaces of the pits. The second semiconductor layer is doped a second conductive type that is different than the first conductive type.

In example embodiments, the active layer may have a multiple quantum well (MQW) structure including a plurality of barrier layers and a plurality of quantum well layer that are alternately stacked on each other.

In example embodiments, the hole injection layer may contact all of the quantum well layers of the active layer along the sloped surfaces of the pit.

In example embodiments, a portion of the hole injection layer may contact the pit enlarging layer.

In example embodiments, the hole injection layer may be on the top surface of the active layer and the sloped surfaces of the pits. A thickness of the hole injection layer may be substantially constant.

In example embodiments, the thickness of the hole injection layer may be about 3 nm to about 5 nm.

In example embodiments, the first semiconductor layer and the second semiconductor layer may include GaN, and the hole injection layer may include InGaN doped the second conductive type.

In example embodiments, a doping density of a portion of the hole injection layer on the top surface of the active layer may be about $10^{20}/cm^3$, and a doping density of a part of the hole injection layer on the sloped surfaces of the pit may be about $7\sim8\times10^{19}/cm^3$.

In example embodiments, the second semiconductor layer may include a flat top surface, and a lower portion of the second semiconductor layer may partially protrude into the pits.

In example embodiments, the semiconductor light emitting device may further include an electron blocking layer between the active layer and the hole injection layer.

In example embodiments, the electron blocking layer and the hole injection layer may be on the top surface of the active layer and the sloped surfaces of the pits. The electron blocking layer and the hole injection layer, respectively, may have substantially constant thicknesses.

In example embodiments, the electron blocking layer may include AlGaN doped the second conductive type, and the hole injection layer may include InGaN doped the second conductive type.

In example embodiments, the semiconductor light emitting device may include an electron blocking layer. The hole injection layer may include a first hole injection layer and a second hole injection layer. The electron blocking layer may be between the first hole injection layer and the second hole injection layer.

In example embodiments, the electron blocking layer, the first hole injection layer, and the second hole injection layer may be on the top surface of the active layer and the sloped surfaces of the pits. The electron blocking layer, the first hole injection layer, and the second hole injection layer may have substantially constant thicknesses.

According to example embodiments, a method of fabricating a semiconductor light emitting device includes growing a first semiconductor layer, growing a pit enlarging layer on the first semiconductor layer, growing on active layer on the pit enlarging layer, growing a hole injection layer, and growing a second semiconductor layer on the hole injection layer. The first semiconductor layer is doped a first conductive type and includes dislocations. An upper surface of the pit enlarging layer and side surfaces of the active layer define pits having sloped surfaces on the dislocations. The hole injection layer is on a top surface of the active layer and the sloped surfaces of the pits. The second semiconductor layer is doped a second conductive type that is different than the first conductive type.

In example embodiments, the growing the active layer may include forming a multiple quantum well (MQW) structure that includes a plurality of barrier layers and a plurality of quantum well layers that are alternately stacked on each other.

The growing the hole injection layer may include forming the hole injection layer so the hole injection layer contacts all of the plurality of quantum well layers of the active layer along the sloped surfaces of the pits. The growing the hole injection layer may include forming the hole injection layer so a portion of the hole injection layer contacts the pit enlarging layer.

In example embodiments, the growing the hole injection layer may include forming the hole injection layer on the top surface of the active layer and the sloped surface of the pits to a substantially constant thickness.

In example embodiments, the first semiconductor layer and the second semiconductor layer may include GaN, and the hole injection layer may include InGaN doped the second conductive type.

In example embodiments, the method may further include forming an electron blocking layer between the active layer and the hole injection layer. The electron blocking layer may include AlGaN doped the second conductive type. The hold injection layer may include InGaN doped the second conductive type.

In example embodiments, the method may further include forming an electron blocking layer on the hole injection layer, and forming an additional hole injection layer on the electron blocking layer.

According to example embodiments, a semiconductor light emitting device includes a first nitride semiconductor layer, a pit enlarging layer on the first nitride semiconductor layer, an active layer on the pit enlarging layer, a second nitride semiconductor layer on the active layer, and a hole injection layer. The first semiconductor layer is doped a first conductive type and includes dislocations therein. An upper surface of the pit enlarging layer and side surfaces of the active layer define pits having sloped surfaces on the dislocations. The second nitride semiconductor layer is doped a second conductive type that is different than the first conductive type. A bottom surface of the second nitride semiconductor layer defines a flat portion and pyramid portions. Each one of the pyramid portions has an apex as a lowermost surface. The hole injection layer extends between the second nitride semiconductor layer and the active layer along the flat portion and the pyramid portions of the second semiconductor layer.

In example embodiments, the active layer may be a multiple quantum well (MQW) structure including a plurality of barrier layers and a plurality of quantum well layers that are alternately stacked on each other. The hole injection layer may directly contact all of the plurality of quantum well layers along the sloped surfaces of the pits.

In example embodiments, the active layer may be a multiple quantum well (MQW) structure including a plurality of barrier layers and a plurality of quantum well layers that are alternately stacked on each other. The pit enlarging layer may include a plurality of third and fourth nitride semiconductor layers alternately stacked on each other. The plurality of quantum well layers and one of the third and fourth nitride semiconductor layers may include the same elements. A stoichiometry of the plurality of quantum well layers may be different than a stoichiometry of the one of the third and fourth nitride semiconductor layers.

In example embodiments, the first nitride semiconductor layer and the second nitride semiconductor layer may include GaN, the hole injection layer may include InGaN doped the second conductive type, and a thickness of the hole injection layer may be substantially constant.

In example embodiments, the hole injection layer may be a first hole injection layer, and the semiconductor light emitting device may further include at least one of an electron blocking layer and a second hole injection layer between the first hole injection layer and the second nitride semiconductor layer.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings:

FIG. 6 is a table showing comparison of performance of the semiconductor light emitting devices according to the above-stated embodiments and performance of a semiconductor light emitting device according to a comparative embodiment;

FIGS. 7A through 7G are schematic sectional views showing a method of fabricating the semiconductor light emitting device shown in FIG. 1;

DETAILED DESCRIPTION

Figure 1:
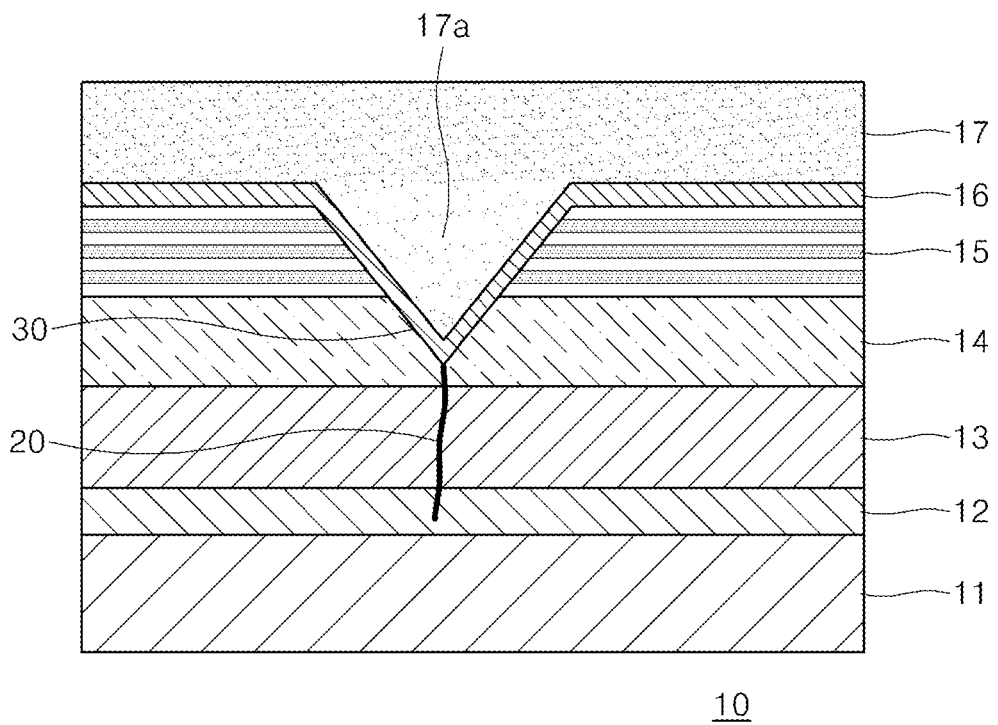
FIG. 1 is a schematic sectional view of a semiconductor light emitting device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure is illustrated in a cross-sectional view, an electronic device may include a plurality of the device structures, as would be illustrated by a plan view of the electronic device. The plurality of device structures may be arranged in an array and/or in a two-dimensional pattern.

FIG. 1 is a schematic sectional view of a semiconductor light emitting device 10 according to example embodiments. Referring to FIG. 1, the semiconductor light emitting device 10 may include a substrate 11, a buffer layer 12 disposed on the substrate 11, a first semiconductor layer 13 disposed on the buffer layer 12, a pit enlarging layer 14 disposed on the first semiconductor layer 13, a active layer 15 disposed on the pit enlarging layer 14, a hole injection layer 16 disposed on the active layer 15, and a second semiconductor layer 17 disposed on the hole injection layer 16.

The semiconductor light emitting device 10 may be formed based on GaN, which is a Group III-V compound semiconductor. In this case, the substrate 11 may be formed of sapphire ($Al_2O_3$) or silicon carbide (SiC) having hexagonal crystalline structure, for example. The buffer layer 12 is a layer for reducing differences between lattice constant of the substrate 11 and lattice constants of GaN-based semiconductor layers formed on the substrate 11, thereby reducing defect densities and stresses at the semiconductor layers formed on the substrate 11. For example, the buffer layer 12 may be formed of AlN or AlInGaN. Generally, lattice constant of the substrate 11 differs from that of the buffer layer 12, and thus dislocation 20 is formed when the buffer layer 12 is grown on the substrate 11. Although FIG. 1 shows only one dislocation 20 for convenience of explanation, a plurality of dislocations 20 may be formed in the reality.

The first semiconductor layer 13 disposed on the buffer layer 12 may be formed of n-GaN doped with an n-type impurity. The n-type impurity may be Si, but is not limited thereto. The first semiconductor layer 13 may function as a clad layer for providing electrons to the active layer 15 described below and confining electrons and holes inside the active layer 15. While the first semiconductor layer 13 is being grown on the buffer layer 12, the dislocation 20 formed in the buffer layer 12 may extend to the first semiconductor layer 13.

The dislocation 20 may increase defect densities and stresses at the active layer 15 formed on the first semiconductor layer 13, and thus reverse leakage current at the semiconductor light emitting device 10 may increase. The pit enlarging layer 14 naturally relieves stresses at the active layer 15 by artificially forming a pit 30, which is an empty space without a crystal, thereby reducing and/or suppressing reverse leakage current. Although FIG. 1 shows the pit enlarging layer 14 merely as a single layer for convenience of explanation, the pit enlarging layer 14 may be formed by alternately growing a plurality of InGaN layers and a plurality of GaN layers. For example, the pit enlarging layer 14 may be formed by stacking about 20 pairs of $In_xGa_{1-x}N$ layers (x<1) and GaN layers. For example, the pit enlarging layer 14 may be formed by stacking about 20 pairs of $In_{0.33}Ga_{0.97}N$ layers and GaN layers. However, the number of pairs of $In_xGa_{1-x}N$ layers (x<1) and GaN layers is not limited to 20 and the value for x may be different (e.g., lower or higher) than 0.03.

As the pit enlarging layer 14 grows, the dislocation 20 may be converted to the pit 30, which is opened upward by about 62 degrees with respect to a direction (0001), which is the direction of growth. As shown in FIG. 1, since the vertical cross-section of the pit 30 has a V-like shape, the pit 30 is generally referred to as a V-pit. The actual shape of the pit 30 may be reversed pyramidal shape having hexagonal horizontal cross-section. Although FIG. 1 shows only one pit 30 for convenience of explanation, a plurality of pits 30 may be formed in the pit enlarging layer 14, like the dislocation 20.

The active layer 15 may be disposed on the pit enlarging layer 14. The active layer 15 emits light by combining electrons and holes. For example, the active layer 15 may have a multiple quantum well (MQW) including a plurality of quantum wells formed of $In_yGa_{1-y}N$ (y<1) and a plurality of barrier layers formed of GaN. For example, the active layer 15 may be formed by stacking about 5 pairs of $In_{0.15}Ga_{0.85}N$ layers and GaN layers. However, y may be different that 0.15. The value of y in the $In_yGa_{1-y}N$ quantum well layers may be greater than the value of x in the $In_xGa_{1-x}N$ layers of the pit enlarging layer 14. Additionally, the number of pairs of quantum wells and barrier layers may alternatively be less than 5 or more than 5. As shown in FIG. 1, the pit 30 formed at the pit enlarging layer 14 may extend to the active layer 15.

The hole injection layer 16 may be disposed on the active layer 15 and may readily provide holes, which have lower mobility than electrons, to all quantum well layers in the active layer 15. To this end, the hole injection layer 16 may be formed on the top surface of the active layer 15. The thickness of the hole injection layer 16 may be overall constant (and/or substantially constant, such as having a thickness that varies less than about 1 or 2 nm). As shown in FIG. 1, the hole injection layer 16 may be formed on the top surface of the active layer 15 and the sloped surface of the pit 30 to a constant thickness (and/or substantially constant thickness, such as having thicknesses that vary less than less than about 1 or 2 nm). Since the pit 30 starts from the pit enlarging layer 14, a portion of the hole injection layer 16 may also contact the pit enlarging layer 14. As the hole injection layer 16 is formed on the sloped surface of the pit 30, the hole injection layer 16 may contact all quantum wells in the active layer 15. The hole injection layer 16 may be formed of p-InGaN doped with a p-type impurity, for example. Thickness of the hole injection layer 16 may be from about 3 nm to about 5 nm, but is not limited thereto.

The second semiconductor layer 17, which may function as a clad layer, may be formed on the hole injection layer 16. The second semiconductor layer 17 may be formed of p-GaN doped with a p-type impurity (e.g., Mg, Zn, Ca, Na, K). As shown in FIG. 1, the second semiconductor layer 17 has the flat top surface, and a lower portion 17a of the second semiconductor layer 17 may extend downward into the pit 30. In other words, an empty space inside the active layer 15 formed by the pit 30 may be filled with the portion 17a of the second semiconductor layer 17. Each lower portion 17a may have a pyramid shape with an apex as a lowermost surface.

Since the hole injection layer 16 may be densely doped and may be formed on the sloped surface of the pit 30, holes may be easily injected to all quantum wells of the active layer 15. If the second semiconductor layer 17 is formed directly on the active layer 15 without the hole injection layer 16, doping density of the portion 17a of the second semiconductor layer 17 filling the pit 30 may not be sufficiently dense, and thus holes may not be readily injected to the active layer 15.

Generally, the direction (0001) of growth of p-GaN, which constitutes the second semiconductor layer 17, significantly differs from a direction (101_1) of the sloped surface of the pit 30. Meanwhile, incorporation efficiency between a p-type dopant (e.g., Mg, Zn, Ca, Na, K, etc.) and GaN depends on shape of crystal surface. Therefore, doping density of the portion 17a of the second semiconductor layer 17 which is disposed in the pit 30 decreases because the direction of growth of the second semiconductor layer 17 differs from a direction of the sloped surface of the pit 30. In other words, doping density of the portion 17a of the second semiconductor layer 17 filling the pit 30 is lower than doping density of the upper portion of the second semiconductor layer 17 formed above the active layer 15. For example, doping density of the upper portion of the second semiconductor layer 17 formed above the active layer 15 may be about $10^{20}/cm^3$, whereas doping density of the portion 17a of the second semiconductor layer 17 filling the pit 30 may be lower than $10^{19}/cm^3$. Therefore, if the hole injection layer 16 is not formed, the portion 17a of the second semiconductor layer 17 having a relatively low doping density contacts the active layer 15, and thus holes may not be sufficiently injected to the active layer 15.

On the contrary, since InGaN used for forming the hole injection layer 16 has lower activation energy than that of GaN and high incorporation efficiency with p-type dopants, high doping density may be embodied in the pit 30. Furthermore, since p-InGaN constituting the hole injection layer 16 may be grown in the nitrogen atmosphere unlike p-GaN, incorporation efficiency with p-type dopants may be further improved. Therefore, doping density of a portion of the hole injection layer 16 above the active layer 15 and doping density of a portion of the hole injection layer 16 in the pit 30 may not be significantly different. For example, doping density of the portion of the hole injection layer 16 above the active layer 15 may be about $10^{20}/cm^3$, whereas doping density of the portion of the hole injection layer 16 in the pit 30 may be about $7\sim8\times10^{19}/cm^3$. Accordingly, the hole injection layer 16 may maintain high doping density in the pit 30, and thus holes may be easily injected to the active layer 15.

Figure 2:
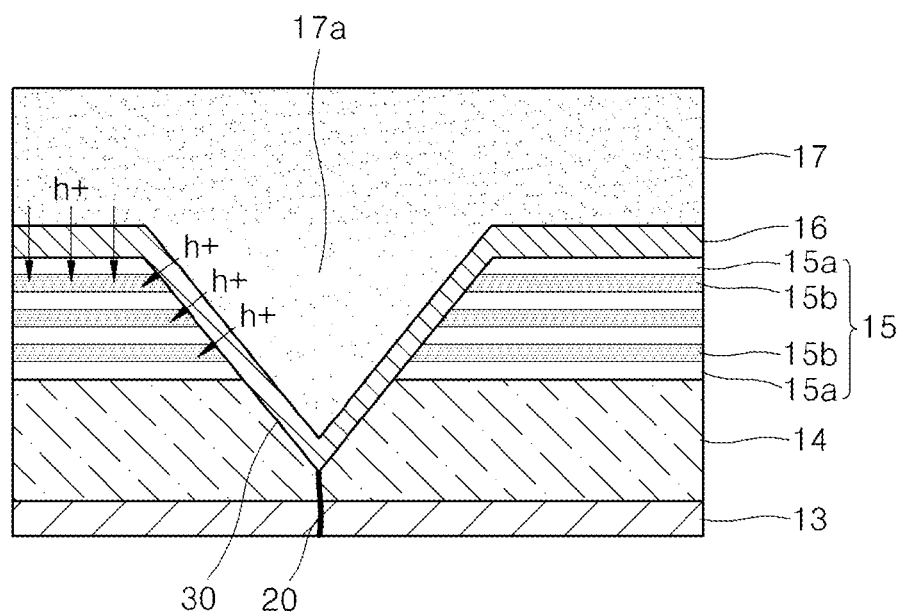
FIG. 2 is a schematic sectional view showing operation mechanism of the semiconductor light emitting device shown in FIG. 1.

For example, referring to FIG. 2, the hole injection layer 16 may not only inject holes from the top surface of the active layer 15 into the active layer 15, but also inject holes directly to all quantum well layers 15b in the active layer 15 along the sloped surface of the pit 30. Therefore, despite of low mobility of holes, holes may be efficiently injected even to the bottommost quantum well layer 15b, which is the farthest layer from the second semiconductor layer 17. Although FIG. 2 shows that the active layer 15 has a MQW structure including the fourth barrier layers 15a and the three quantum well layers 15b, it is merely an example, and the number of barrier layers 15a and quantum well layers 15b alternately stacked may vary. The numbers of the barrier layers 15a and the quantum well layers 15b may vary as an occasion demands.

Figure 3:
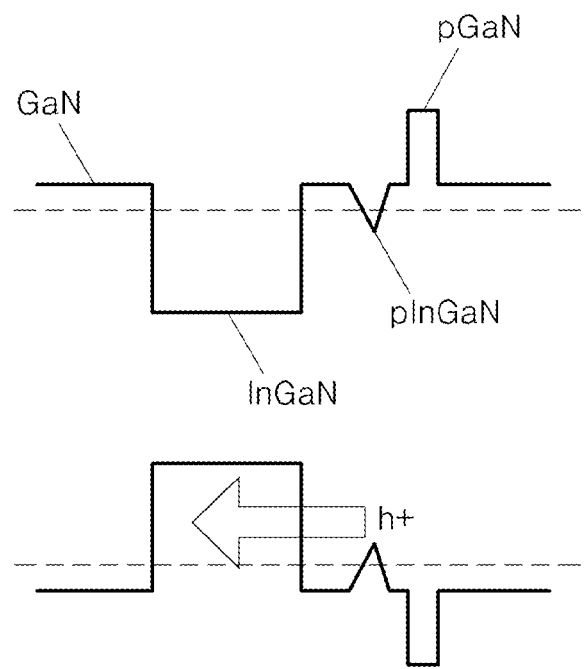
FIG. 3 is a schematic energy band diagram showing operation mechanism of the semiconductor light emitting device shown in FIG. 1.

Furthermore, referring to the energy band diagram shown in FIG. 3, the quantum well layer 15b having low energy level (e.g., InGaN) and the barrier layer 15a having high energy level (e.g., GaN) are repeatedly disposed, and the second semiconductor layer 17 having the highest energy level is disposed at the outermost location. Furthermore, the hole injection layer 16 (e.g., p-InGaN) is disposed between the barrier layer 15a and the second semiconductor layer 17. As shown in FIG. 3, energy level of the hole injection layer 16 is between that of the barrier layer 15a and that of the quantum well layer 15b. Therefore, holes generated by the second semiconductor layer 17 may tunnel through the hole injection layer 16 having high doping density and may be injected to the quantum well layer 15b. As a result, luminescence efficiency and light output power of the semiconductor light emitting device 10 may be improved.

Figure 4:
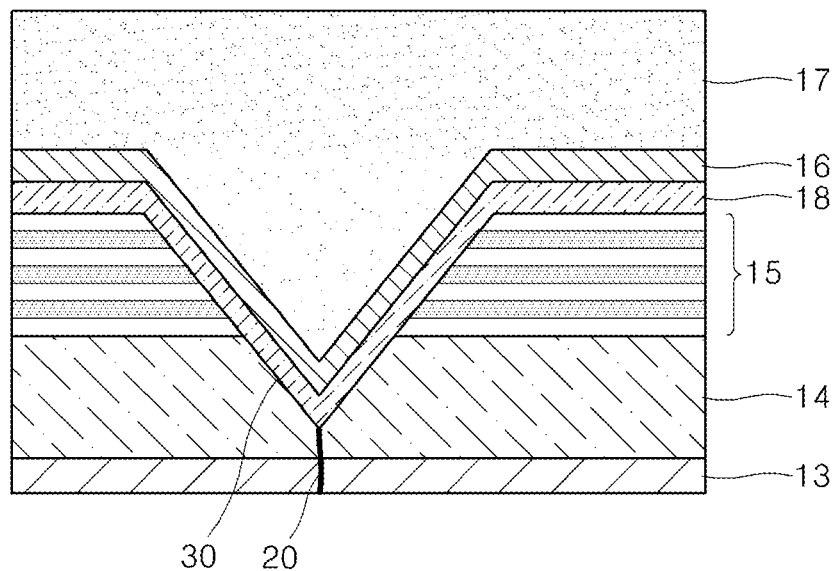
FIG. 4 is a schematic sectional view of a semiconductor light emitting device according to example embodiments.

FIG. 4 is a schematic sectional view of a semiconductor light emitting device according to example embodiments. Referring to FIG. 4, according to example embodiments, the semiconductor light emitting device may further include an electron blocking layer 18 between the active layer 15 and the hole injection layer 16. For example, the electron blocking layer 18 may be formed of p-AlGaN. As shown in FIG. 4, the electron blocking layer 18 may be formed on the top surface of the active layer 15 and the sloped surface of the pit 30 to a constant thickness (and/or a substantially constant thickness, such as having a thickness that varies less than or equal to about 1 or 2 nm). For example, the thickness of the electron blocking layer 18 may be from about 10 nm to about 20 nm, but is not limited thereto. The hole injection layer 16 may be formed on the top surface of the electron blocking layer 18 to a constant thickness (and/or a substantially constant thickness). The electron blocking layer 18 limits and/or prevents electrons from moving out of the active layer 15 into the second semiconductor layer 17, thereby improving combining efficiency of electrons and hole in the active layer 15.

Figure 5:
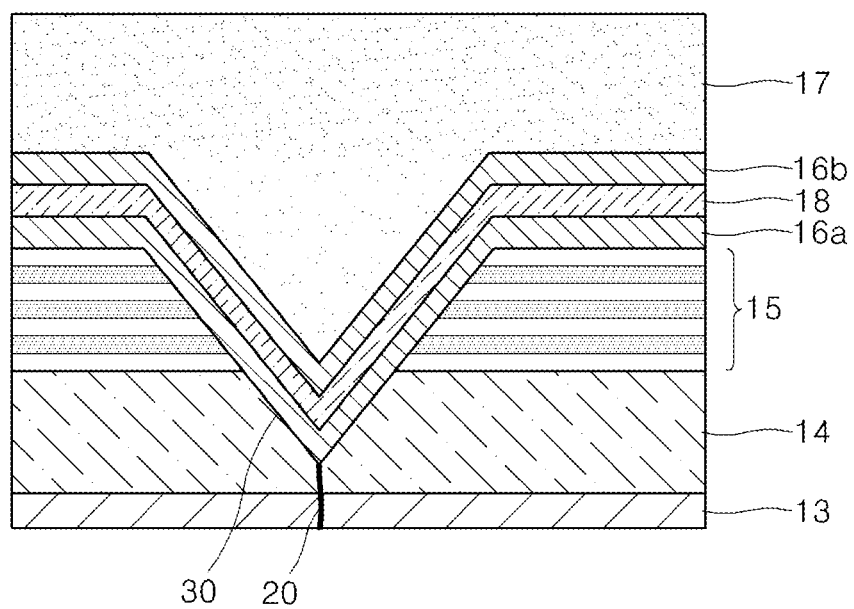
FIG. 5 is a schematic sectional view of a semiconductor light emitting device according to example embodiments.

Furthermore, FIG. 5 is a schematic sectional view of a semiconductor light emitting device according to example embodiments. Referring to FIG. 5, according to example embodiments, the semiconductor light emitting device may include two hole injection layers 16a and 16b and the electron blocking layer 18 disposed therebetween. In other words, the first hole injection layer 16a may be formed on the top surface of the active layer 15 and the sloped surface of the pit 30 to a constant thickness (and/or a substantially constant thickness, such as having a thickness that varies less than or equal to about 1 or 2 nm), the electron blocking layer 18 may be formed thereon to a constant thickness (and/or a substantially constant thickness, such as having a thicknesses that vary less than or equal to about 1 or 2 nm), and the second hole injection layer 16b may be formed on the electron blocking layer 18 to a constant thickness (and/or a substantially constant thickness, such as having a thickness that varies less than or equal to about 1 or 2 nm). By further arranging the second hole injection layer 16b on the electron blocking layer 18, hole injection efficiency to the active layer 15 may be further improved.

FIG. 6 is a table showing comparison of the performance of semiconductor light emitting devices according to example embodiments and the performance of a semiconductor light emitting device according to a comparative embodiment. In FIG. 6, the semiconductor light emitting device according to a comparative embodiment is a semiconductor light emitting device in which the second semiconductor layer 17 is disposed directly on the active layer 15, whereas the semiconductor light emitting device according to example embodiments is the semiconductor light emitting device shown in FIG. 4 including the single electron blocking layer 18 and the single hole injection layer 16. Furthermore, in FIG. 6, IR denotes leakage current in case where a reverse voltage is applied to the semiconductor light emitting device, IF denotes leakage current in case where a forward voltage is applied to the semiconductor light emitting device, VR denotes a voltage between both ends of the semiconductor light emitting device in case where a reverse voltage is applied to the semiconductor light emitting device, VF1 denotes a voltage between both ends of the semiconductor light emitting device in case where a forward voltage is applied to the semiconductor light emitting device, and VF2 denotes a driving voltage. Here, it is favorable that the IR, the IF, and the VF2 are low and the VR and the VF are high. Referring to FIG. 6, there is no significant difference between the comparative embodiment and the light emitting device according to example embodiments regarding the IR, the IF, and the VF1. However, the VR is significantly improved in the light emitting device according to example embodiments as compared to that of the comparative embodiment, and driving voltage in the light emitting device according to example embodiments is slightly lower than that of the comparative embodiment. Particularly, light output power of the light emitting device according to example embodiments may be about 7.7% higher than that of the comparative embodiment.

FIGS. 7A through 7G are schematic sectional views showing a method of fabricating the semiconductor light emitting device 10 shown in FIG. 1. Hereinafter, the method of fabricating the semiconductor light emitting device 10 will be described with reference to FIGS. 7A through 7G.

First, referring to FIG. 7A, the buffer layer 12 is grown on the substrate 11. The substrate 11 may be formed of sapphire ($Al_2O_3$) or silicon carbide (SiC) having hexagonal crystalline structure, for example. Alternatively, the substrate 11 may be formed of GaAs, GaN, ZnO, GaP, InP, etc. The buffer layer 12 may be formed of AlN or AlInGaN and may have a thickness from about 10 nm to about 10 um. As shown in FIG. 7A, due to a difference between lattice constants of the substrate 11 and the buffer layer 12, the dislocation 20 is formed during the growth of the buffer layer 12. The dislocation 20 may extend to the top surface of the buffer layer 12.

Next, referring to FIG. 7B, the first semiconductor layer 13 is grown on the buffer layer 12. The first semiconductor layer 13 may be formed of n-GaN, and may be grown to a thickness from about 10 nm to about 10 um by using any of methods including hydride vapor phase epitaxy (HVPE), Metal organic chemical vapor deposition (MOCVD), molecular beam epitaxy (MBE), etc. As shown in FIG. 7B, the dislocation 20 formed in the buffer layer 12 may extend to the first semiconductor layer 13.

Figure 7C:
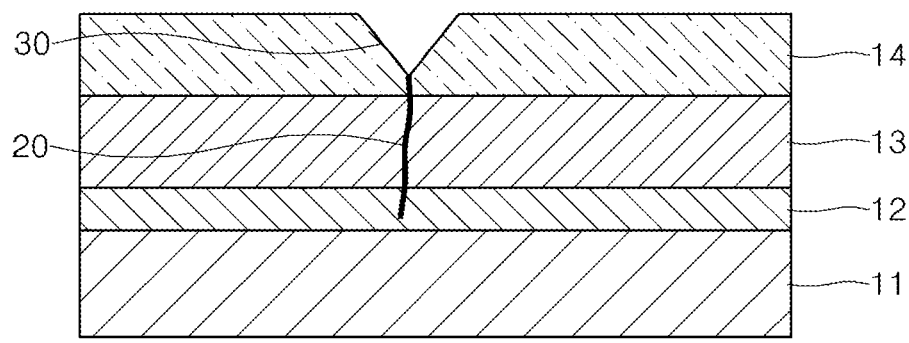

Next, referring to FIG. 7C, to relieve stresses due to the dislocation 20, the pit enlarging layer 14 may be grown on the first semiconductor layer 13. The pit enlarging layer 14 may be formed by alternately stacking about 20 pairs of $In_xGa_{1-x}N$ layers (x<1) and GaN layers. For example, the pit enlarging layer 14 may be formed by alternately stacking about 20 pairs of $In_{0.03}Ga_{0.97}N$ layers and GaN layers. However, the number of pairs of $In_xGa_{1-x}N$ layers (x<1) and GaN layers is not limited to 20 and the value for x may be different (e.g., lower or higher) than 0.03. As shown in FIG. 7C, the dislocation 20 becomes the pit 30 which is opened upward by about 62 degrees with respect to the direction (0001), which is the direction of growth of the pit enlarging layer 14. As the pit enlarging layer 14 grows, size of the pit 30 increases. The overall thickness of the pit enlarging layer 14 may be from about 10 nm to about 1000 nm.

Figure 7D:
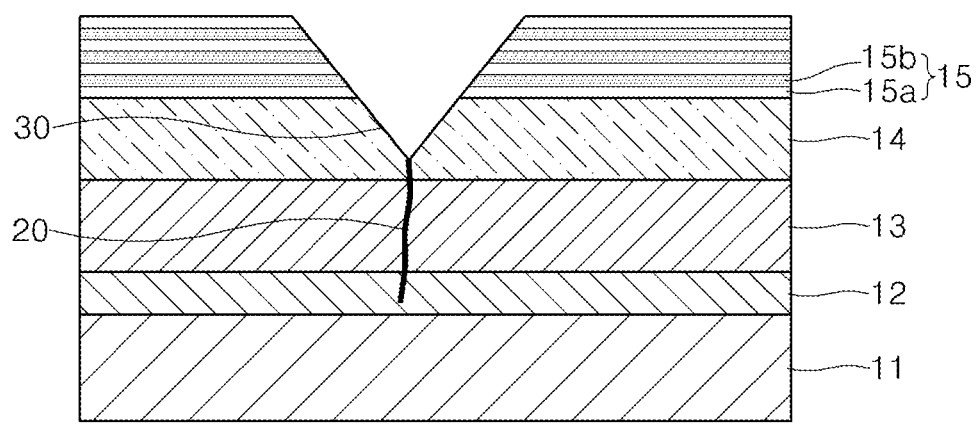
Figure 7E:
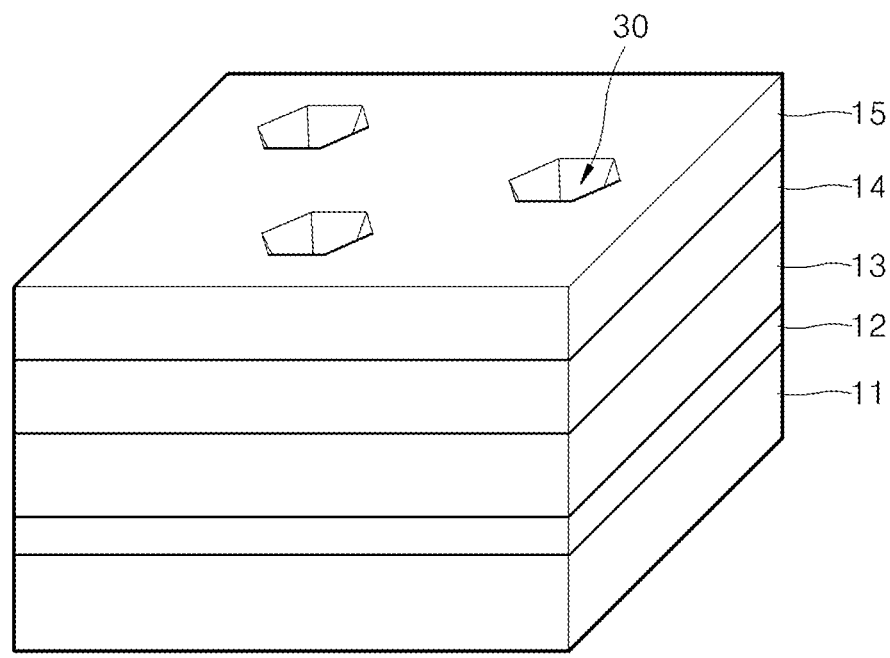

Next, Referring to FIG. 7D, the active layer 15 is grown on the pit enlarging layer 14. The active layer 15 may have a multiple quantum well (MQW) structure in which the plurality of barrier layers 15a and the plurality of quantum well layers 15b are alternately disposed. For example, the quantum well layer 15b may be formed of $In_yGa_{1-y}N$ (y<1), whereas the barrier layer 15a may be formed of GaN. For example, the quantum well layer 15b may be formed of $In_{0.15}Ga_{0.85}N$, whereas the barrier layer 15a may be formed of GaN. However, y may be different that 0.15. The value of y in the $In_yGa_{1-y}N$ quantum well layers may be greater than the value of x in the $In_xGa_{1-x}N$ layers of the pit enlarging layer 14. Although FIG. 7D shows the three quantum well layers 15b and the four barrier layers 15a, the quantum well layer 15b and the barrier layer 15a may be further stacked. Thickness of the active layer 15 may vary according to light emitting wavelengths and the number of pairs of the quantum well layer 15b and the barrier layer 15a. As shown in FIG. 7D, the pit 30 formed at the pit enlarging layer 14 may extend to the active layer 15, and the pit 30 becomes larger at the active layer 15. FIG. 7D shows that the cross-section of the pit 30 has a simple V-like shape. However, referring to FIG. 7E, the actual shape of the pit 30 may be a reversed pyramidal shape having hexagonal horizontal cross-section.

Figure 7F:
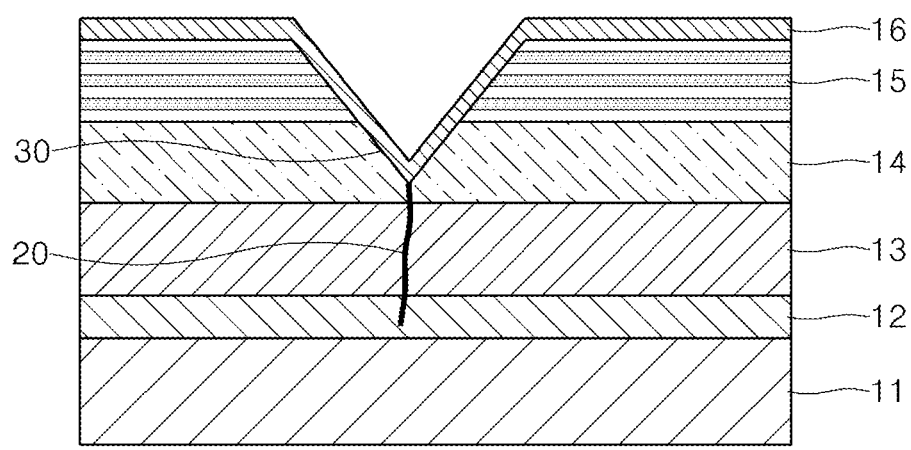

Referring to FIG. 7F, the hole injection layer 16 is grown to a constant thickness (and/or a substantially constant thickness, such as having a thickness that varies less than or equal to about 1 or 2 nm) on the active layer 15. The hole injection layer 16 may be formed of p-InGaN, for example. As shown in FIG. 7F, the hole injection layer 16 may be formed on the top surface of the active layer 15 and the sloped surface of the pit 30 to a constant thickness. As a result, a portion of the hole injection layer 16 contacts the pit enlarging layer 14 and may contact all of the quantum well layers 15b in the active layer 15 along the sloped surface of the pit 30. The hole injection layer 16 may be grown to a thickness from about 3 nm to about 5 nm at a pressure about 100 Torr and a temperature about 930° C. in a nitrogen atmosphere.

Figure 7G:
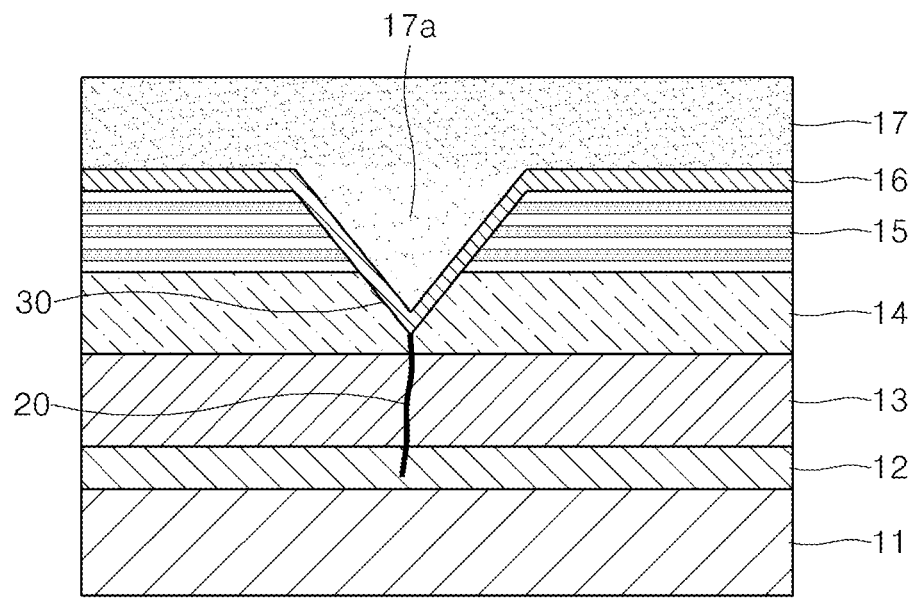

Lastly, referring to FIG. 7G, the second semiconductor layer 17 is grown on the hole injection layer 16. The second semiconductor layer 17 may be formed of p-GaN, for example, and may be grown to a thickness from about 10 nm to about 1000 nm in a hydrogen atmosphere or an atmosphere containing hydrogen by using a method, such as HVPE, MOCVD, or MBE. As shown in FIG. 7G, the second semiconductor layer 17 has the flat top surface, and the portion 17a of the second semiconductor layer 17 fills the pit 30.

Figure 8:
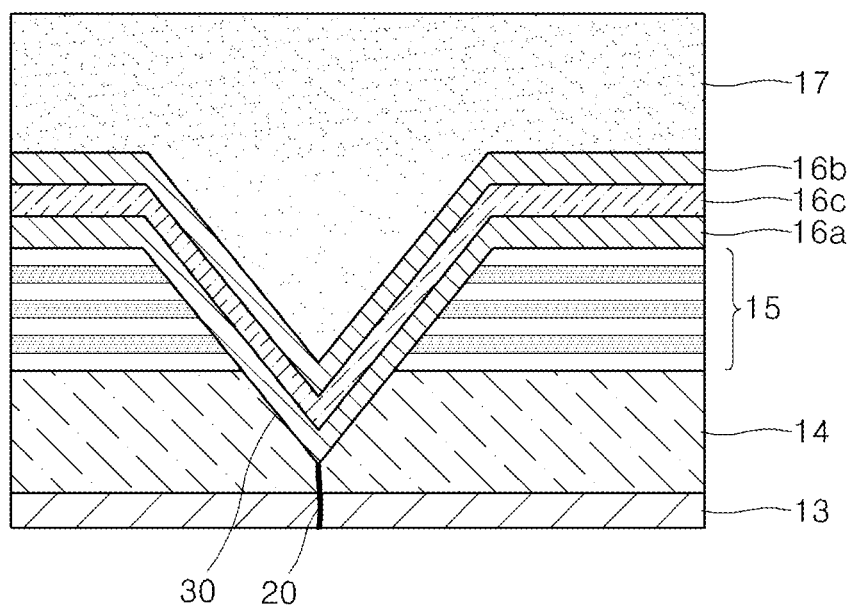
FIG. 8 is a schematic sectional view of a semiconductor light emitting device according to example embodiments.

FIG. 8 is a schematic sectional view of a semiconductor light emitting device according to example embodiments.

Referring to FIG. 8, a semiconductor light emitting device according to example embodiments may be the same as the semiconductor light emitting device 10 described previously with reference to FIG. 1. However, as shown in FIG. 8, a semiconductor light emitting device according to example embodiments may include a plurality of hole injection layers 16a to 16c instead of just the one hole injection layer 16 illustrated in FIG. 1. The hole injection layers 16a to 16c may each be formed of p-InGaN doped with a p-type impurity, for example. The hole injection layers 16a to 16c may have different In concentrations and/or concentrations of the p-type impurity.

Figure 9:
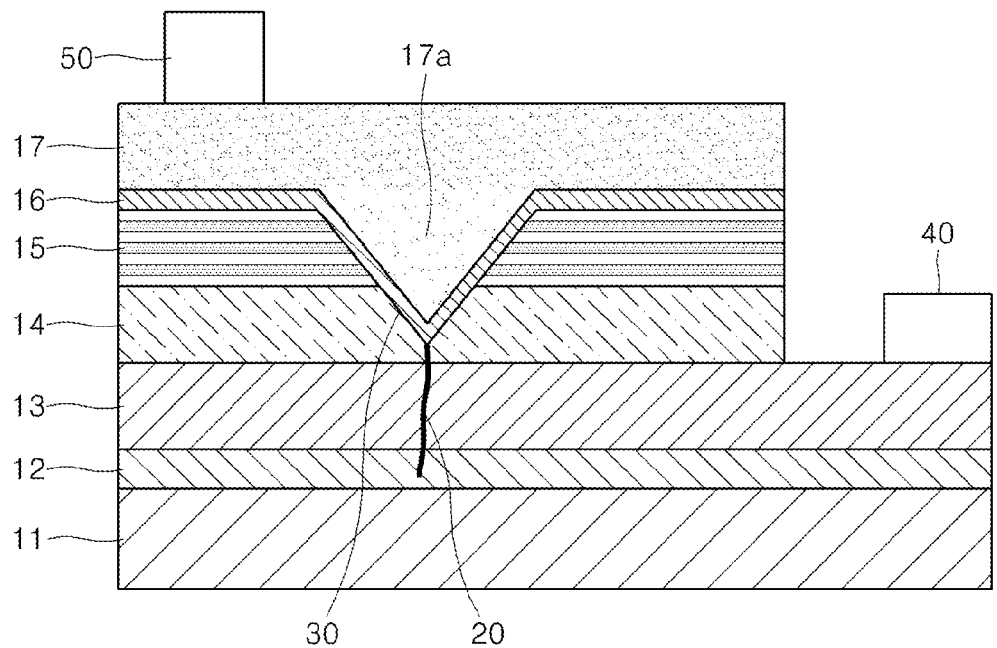
FIG. 9 is a schematic sectional view of a semiconductor light emitting device according to example embodiments.

FIG. 9 is a schematic sectional view of a semiconductor light emitting device according to example embodiments.

Referring to FIG. 9, a semiconductor light emitting device according to example embodiments may be the same as the semiconductor light emitting device 10 described previously with reference to FIG. 1. However, the semiconductor light emitting device may further include a first electrode 40 on an upper surface of the first semiconductor layer 13 and a second electrode 50 on an upper surface of the second semiconductor layer 17.

It should be understood that example embodiments described therein should be considered in a descriptive sense only and not for purposes of limitation. Descriptions of features or aspects within each semiconductor light emitting device according to example embodiments and/or method of manufacturing the same should typically be considered as available for other similar features or aspects in other semiconductor light emitting devices according to example embodiments and/or methods of manufacturing the same.

While some example embodiments have been particularly shown and described, it will be understood by one of ordinary skill in the art that variations in form and detail may be made therein without departing from the spirit and scope of the claims.

What is claimed is:

1. A semiconductor light emitting device comprising:
a first semiconductor layer, the first semiconductor layer being doped a first conductive type and including dislocations therein;
a pit enlarging layer on the first semiconductor layer;
an active layer on the pit enlarging layer, an upper surface of the pit enlarging layer and side surfaces of the active layer defining pits having sloped surfaces on the dislocations, the pits being reverse pyramidal spaces that extend through the active layer into the pit enlarging layer;
a hole injection layer on a top surface of the active layer and the sloped surfaces of the pits, the hole injection layer extending into the pits through the active layer; and
a second semiconductor layer on the hole injection layer, the second semiconductor layer being doped a second conductive type that is different than the first conductive type, an energy level of the second semiconductor layer being greater than an energy level of the hole injection layer.

2. The semiconductor light emitting device of claim 1, wherein
the active layer has a multiple quantum well (MQW) structure including a plurality of barrier layers and a plurality of quantum well layers that are alternately stacked on each other.

3. The semiconductor light emitting device of claim 2, wherein the hole injection layer contacts all of the plurality of quantum well layers of the active layer along the sloped surfaces of the pits.

4. The semiconductor light emitting device of claim 1, wherein a portion of the hole injection layer contacts the pit enlarging layer.

5. The semiconductor light emitting device of claim 1, wherein
the hole injection layer is on the top surface of the active layer and the sloped surface of the pits, and
a thickness of the hole injection layer is substantially constant.

6. The semiconductor light emitting device of claim 5, wherein the thickness of the hole injection layer is from about 3 nm to about 5 nm.

7. The semiconductor light emitting device of claim 1, wherein
the first semiconductor layer and the second semiconductor layer include GaN,
the hole injection layer includes InGaN doped the second conductive type.

8. The semiconductor light emitting device of claim 7, wherein
a doping density of a portion of the hole injection layer on the top surface of the active layer is about $10^{20}/cm^3$, and
a doping density of a part of the hole injection layer on the sloped surfaces of the pits is about $7\text{-}8\times10^{19}/cm^3$.

9. The semiconductor light emitting device of claim 1, wherein
the second semiconductor layer includes a flat top surface, and
a lower portion of the second semiconductor layer partially protrudes into the pits.

10. The semiconductor light emitting device of claim 1, further comprising: an electron blocking layer between the active layer and the hole injection layer.

11. The semiconductor light emitting device of claim 10, wherein the electron blocking layer and the hole injection layer are on the top surface of the active layer and the sloped surfaces of the pits, and
the electron blocking layer and the hole injection layer, respectively, have substantially constant thicknesses.

12. The semiconductor light emitting device of claim 11, wherein the electron blocking layer includes AlGaN doped the second conductive type, and
the hole injection layer includes InGaN doped the second conductive type.

13. A semiconductor light emitting device comprising:
a first semiconductor layer, the first semiconductor layer being doped a first conductive type and including dislocations therein;
a pit enlarging layer on the first semiconductor layer;
an active layer on the pit enlarging layer, an upper surface of the pit enlarging layer and side surfaces of the active layer defining pits having sloped surfaces on the dislocations, the pits being reverse pyramidal spaces;
a hole injection layer on a top surface of the active layer and the sloped surfaces of the pits, the hole injection layer including a first hole injection layer and a second hole injection layer;
a second semiconductor layer on the hole injection layer, the second semiconductor layer being doped a second conductive type that is different than the first conductive type; and
an electron blocking layer formed between the first hole injection layer and the second hole injection layer.

14. The semiconductor light emitting device of claim 13, wherein the electron blocking layer, the first hole injection layer, and the second hole injection layer are on the top surface of the active layer and the sloped surfaces of the pits, and
the electron blocking layer, the first hole injection layer, and the second hole injection layer have substantially constant thicknesses, respectively.

15. A method of fabricating a semiconductor light emitting device, the method comprising:
growing a first semiconductor layer, the first semiconductor layer being doped a first conductive type, and the first semiconductor layer including dislocations;
growing a pit enlarging layer on the first semiconductor layer;
growing an active layer on the pit enlarging layer, an upper surface of the pit enlarging layer and side surfaces of the active layer defining pits having sloped surfaces on the dislocations, the pits being reverse pyramidal spaces that extend through the active layer into the pit enlarging layer;
growing a hole injection layer on a top surface of the active layer and the sloped surfaces of the pits, the hole injection layer extending into the pits through the active layer; and
growing a second semiconductor layer on the hole injection layer, the second semiconductor layer being doped a second conductive type that is different than the first conductive type, an energy level of the second semiconductor layer being greater than an energy level of the hole injection layer.

16. The method of claim 15, wherein
the growing the active layer includes forming a multiple quantum well (MQW) structure that includes a plurality of barrier layers and a plurality of quantum well layers that are alternately stacked on each other,
the growing the hole injection layer includes forming the hole injection layer so the hole injection layer contacts all of the plurality of quantum well layers of the active layer along the sloped surfaces of the pits, and
the growing the hole injection layer includes forming the hole injection layer so a portion of the hole injection layer contacts the pit enlarging layer.

17. The method of claim 15, wherein the growing the hole injection layer includes forming the hole injection layer on the top surface of the active layer and the sloped surface of the pits to a substantially constant thickness.

18. The method of claim 15, wherein
the first semiconductor layer and the second semiconductor layer include GaN, and
the hole injection layer includes InGaN doped the second conductive type.

19. The method of claim 15, further comprising:
forming an electron blocking layer between the active layer and the hole injection layer, wherein the electron blocking layer includes AlGaN doped the second conductive type, and
the hole injection layer includes InGaN doped the second conductive type.

20. The method of claim 15, further comprising:
forming an electron blocking layer on the hole injection layer; and
forming an additional hole injection layer on the electron blocking layer.

* * * * *